United States Patent
Butler

(10) Patent No.: US 10,468,246 B2
(45) Date of Patent: Nov. 5, 2019

(54) METHOD OF PREPARING DIAMOND SUBSTRATES FOR CVD NANOMETRIC DELTA DOPING

(71) Applicant: Euclid TechLabs, LLC, Solon, OH (US)

(72) Inventor: James E Butler, Huntingtown, MD (US)

(73) Assignee: Euclid Techlabs, LLC, Solon, OH (US)

( * ) Notice: Subject to any disclaimer, the term of this patent is extended or adjusted under 35 U.S.C. 154(b) by 0 days.

(21) Appl. No.: 15/889,542

(22) Filed: Feb. 6, 2018

(65) Prior Publication Data

US 2018/0174834 A1 Jun. 21, 2018

Related U.S. Application Data

(62) Division of application No. 15/258,624, filed on Sep. 7, 2016, now Pat. No. 9,922,823.

(51) Int. Cl.
*H01L 21/02* (2006.01)
*H01L 21/32* (2006.01)
(Continued)

(52) U.S. Cl.
CPC .. *H01L 21/02527* (2013.01); *H01J 37/32192* (2013.01); *H01J 37/32201* (2013.01); *H01J 37/32449* (2013.01); *H01J 37/32467* (2013.01); *H01J 37/32724* (2013.01); *H01L 21/02019* (2013.01); *H01L 21/02024* (2013.01); *H01L 21/0262* (2013.01); *H01L 21/02376* (2013.01); *H01L 21/02579* (2013.01); *H01L 21/02584* (2013.01); *H01L 21/02656* (2013.01); *H01L 21/02658* (2013.01); *H01J 2237/3321* (2013.01); *H01L 21/02634* (2013.01); *H01L 22/12* (2013.01); *H01L 22/26* (2013.01)

(58) Field of Classification Search
CPC .................................................. H01L 21/02527
See application file for complete search history.

(56) References Cited

U.S. PATENT DOCUMENTS

2003/0124849 A1* 7/2003 Ihara ................... B81C 1/00547
438/689
2004/0182308 A1* 9/2004 Scarsbrook ............ A44C 17/00
117/68

(Continued)

*Primary Examiner* — Moazzam Hossain
*Assistant Examiner* — Omar F Mojaddedi
(74) *Attorney, Agent, or Firm* — Maine Cernota & Rardin

(57) ABSTRACT

A method of preparing a diamond crystal substrate for epitaxial deposition thereupon of a delta doping layer includes preparing an atomically smooth, undamaged diamond crystal substrate surface, which can be in the (100) plane, by polishing the surface and then etching the surface to remove subsurface damage caused by the polishing. The polishing can include a rough polish, for example in the (010) direction, followed by a fine polish, for example in the (011) direction, that removes the polishing tracks from the rough polishing. After etching the polished face can have a roughness Sa of less than 0.3 nm. An inductively coupled reactive ion etcher can apply the etching at a homogeneous etch rate using an appropriate gas mixture such as using argon and chlorine to remove between 0.1 and 10 microns of material from the polished surface.

14 Claims, 7 Drawing Sheets

(51) Int. Cl.
*C30B 29/04* (2006.01)
*H01J 37/32* (2006.01)
*H01L 21/66* (2006.01)

(56) References Cited

U.S. PATENT DOCUMENTS

| | | | | |
|---|---|---|---|---|
| 2007/0051625 A1* | 3/2007 | Pickles | ................ | G01N 27/308 |
| | | | | 204/400 |
| 2008/0170981 A1* | 7/2008 | Genis | .................... | C30B 29/04 |
| | | | | 423/446 |
| 2010/0108882 A1* | 5/2010 | Zewail | ................... | H01J 37/22 |
| | | | | 250/307 |
| 2010/0166636 A1* | 7/2010 | Yamada | ................. | C30B 25/00 |
| | | | | 423/446 |
| 2012/0051996 A1* | 3/2012 | Scarsbrook | ............ | B82Y 10/00 |
| | | | | 423/446 |
| 2016/0348277 A1* | 12/2016 | Markham | ............. | C30B 25/186 |

\* cited by examiner

METHOD OF PREPARING DIAMOND SUBSTRATES FOR CVD NANOMETRIC DELTA DOPING

RELATED APPLICATIONS

This application is a divisional of U.S. application Ser. No. 15/258,624, filed Sep. 7, 2016, which is herein incorporated by reference in its entirety for all purposes.

FIELD OF THE INVENTION

The invention relates to reactors and methods for epitaxial growth of diamond, and more particularly to chemical vapor deposition ("CVD") reactors and methods for creating nanometric delta doped layers in epitaxially grown single crystals of diamond.

BACKGROUND OF THE INVENTION

Diamond is of strong interest as a potential semiconductor material for high voltage, high frequency, and/or high power active and passive electronic devices because of its superlative materials properties, including high electronic carrier mobilities, high breakdown field strength, high thermal diffusivity, favorable matrix for quantum devices, as well as many other desirable optical, chemical, and materials properties. However, a major barrier to exploiting diamond for active electronic applications is that there are no dopants known that have a sufficiently low thermal activation energy barrier to create a concentration of electronic carriers and a carrier mobility in diamond at room temperature that is adequate for most devices of interest.

While there are many known defect and impurity states in the wide bandgap (5.45 eV) of diamond, several of which can act as donors or acceptors of electronic charge, only boron (creating an acceptor state) and phosphorous (creating a donor state) have been demonstrated to be reliable dopants. Boron, the most commonly used diamond dopant, has the smallest activation energy of 0.37 eV at low doping concentrations ($<10^{17}$ cm$^{-3}$). However, this activation energy is still high enough to ensure that only a fraction of the boron present is activated at room temperature, leading to relatively low concentrations of free carriers.

Increasing the boron concentration in diamond reduces the activation energy, such that at a concentration of approximately $3 \times 10^{20}$ cm$^{-3}$ the metal-to-insulator transition point occurs and a fully-activated impurity band is formed via the quantum tunneling of holes between neighboring boron acceptor states. Unfortunately, as the activation energy of the holes decreases, so does carrier mobility, not only because of the increased impurity scattering but also due to the onset of a low-mobility, hopping-like conduction. The resulting material is one that has sub-unity carrier mobility and typical sheet carrier densities in excess of those that are readily controlled, for example, by a typical field effect transistor (FET).

One approach to creating both high mobility and high carrier concentrations for electronic materials in two dimensions is the formation of "nanometric delta doped" layers, which are heavily doped layers, typically less than five nanometers in thickness, that are located adjacent to high mobility intrinsic material, so that a fraction of the carriers created by the heavily ionized dopant layer reside in the adjacent high mobility layer.

The success of "delta doping" requires the epitaxial growth of a very thin, heavily doped "delta layer" that is typically between 1 and 2 nm thick and is preferably doped to a concentration that is above the metal insulator transition, which for boron in diamond means a concentration of at least approximately $4 \times 10^{20}$ cm$^{-3}$. Successful delta doping further requires that the interface between the doped "delta" layer and the high mobility intrinsic layer (containing less than $10^{17}$ cm$^{-3}$ boron atoms) must be abrupt, and must also be atomically smooth, so as to minimize carrier scattering.

Recent attempts at delta doping of diamond with boron have failed to demonstrate the theoretically expected performance, and have shown low carrier mobilities, low sheet carrier concentrations, and/or low channel mobility. Some of these studies have attributed this disappointing performance to poor lateral homogeneity and interrupted morphology of the delta layers. Carrier mobilities measured in these studies did not exceed the range of 1 to 4.4 cm$^2$/Vsec which is typical of bulk diamond doped with boron above the metal insulator transition level of 4 to $5 \times 10^{20}$ cm$^{-3}$. These results are well short of the values of approximately 100 cm$^2$/Vsec mobility and $10^{13}$ cm$^{-2}$ sheet carrier concentrations that are required for the implementation of doped layers of diamond in practical electronic devices.

What is needed, therefore, is an apparatus and method for creating nanometric delta doped layers in epitaxial diamond with interfaces between the doped and high mobility layers that are sufficiently abrupt and smooth to provide at least 100 cm$^2$/Vsec carrier mobility and $10^{13}$ cm$^{-2}$ sheet carrier concentrations.

SUMMARY OF THE INVENTION

An apparatus and method is disclosed for creating nanometric delta doped layers in epitaxial diamond with interfaces between the doped and high mobility layers that are sufficiently abrupt and smooth to provide at least 100 cm$^2$/Vsec carrier mobility and $10^{13}$ cm$^{-2}$ sheet carrier concentrations. The disclosed apparatus includes a novel switched-chamber gas supply that enables rapid switching between gas sources by maintaining constant loads or "impedances" on the outlets of the gas sources, thereby minimizing any turbulence and gas mixing caused by the switching. The method further includes preparation of an atomically smooth, undamaged single crystal diamond substrate surface by finely polishing the surface, preferably in or near the (100) plane, and then etching the surface after polishing to remove any subsurface polishing damage. Embodiments of the method further include maintaining rapid gas flows while adopting extraordinarily slow growth rates to create the sharpest possible interfaces.

Embodiments further include using Type IIa single crystal diamond as the substrate. In various embodiments a gas phase chemical getter reactant is used to suppress any residual boron incorporation in the intrinsic layers. Embodiments further include heating and maintaining the single crystal diamond substrate surface at a temperature between 700 and 1100° C. during the epitaxial growth.

The present invention is a method of preparing a diamond crystal substrate for epitaxial deposition thereupon of a delta doping layer. The method includes applying a first polishing to a deposition face of the diamond crystal, and etching the deposition face of the diamond crystal, thereby removing subsurface damage caused by the polishing step.

In embodiments, the first polishing provides a macroscopically flat surface on the diamond crystal that is oriented approximately in the (100) crystallographic plane of the diamond crystal. In some of these embodiments, the first polishing is applied in a direction that is within five degrees of the (010) direction of the diamond crystal.

Various embodiments further include applying a second polishing to the deposition face of the diamond crystal before etching the polished face. In some of these embodiments, the second polishing is applied in a direction that is within five degrees of the (011) direction of the diamond crystal. In certain of these embodiments, the second polishing is applied until polishing tracks resulting from the first polishing are no longer detectable by optical interferometry. In various of these embodiments applying the second polishing includes polishing the deposition face of the diamond crystal using a cast iron skive plate charged with diamond grit of size less than 0.5 microns and revolving at between 1500 rpm and 3000 rpm. And some of these embodiments further include orienting the diamond crystal relative to the skive plate within five degrees of the (011) direction of the diamond crystal.

In embodiments, after etching the polished face has a roughness Sa of less than 0.3 nm over at least an 80×80 micron sampling area.

In certain embodiments, etching the polished face of the diamond crystal includes etching the polished face using an inductively coupled reactive ion etcher.

In various embodiments, etching the polished face of the diamond crystal includes etching the polished face using argon and chlorine to remove between 0.1 and 10 microns of material from the deposition surface of the diamond crystal.

In some embodiments, the diamond crystal has a dislocation density below $10^6$ cm$^{-2}$. In other embodiments, the diamond crystal has a dislocation density below $10^2$ cm$^{-2}$.

In embodiments, the diamond crystal is a plate of single crystal type IIa diamond having no nitrogen detectable by IR absorption spectroscopy.

In exemplary embodiments, the diamond crystal is a plate of single crystal type 1b HPHT diamond cut from a single (100) growth sector of a HPHT synthetic diamond having a dislocation density that is less than $10^4$/cm$^2$.

In various embodiments, the diamond crystal is a plate of single crystal type 1b HPHT diamond cut from a single (100) growth sector of a HPHT synthetic diamond having a dislocation density that is less than $10^2$/cm$^2$.

In some embodiments, the diamond crystal has dimensions of at least 3 mm×3 mm×0.5 mm. And in other embodiments, the diamond crystal has dimensions of at least 3.5 mm×3.5 mm×0.5 mm.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

The present invention is an apparatus and method for creating nanometric delta doped layers in epitaxial diamond with interfaces between the doped and high mobility layers that are sufficiently abrupt and smooth to provide at least 100 cm$^2$/Vsec carrier mobility and $10^{13}$ cm$^{-2}$ carrier concentration.

Figure 1:
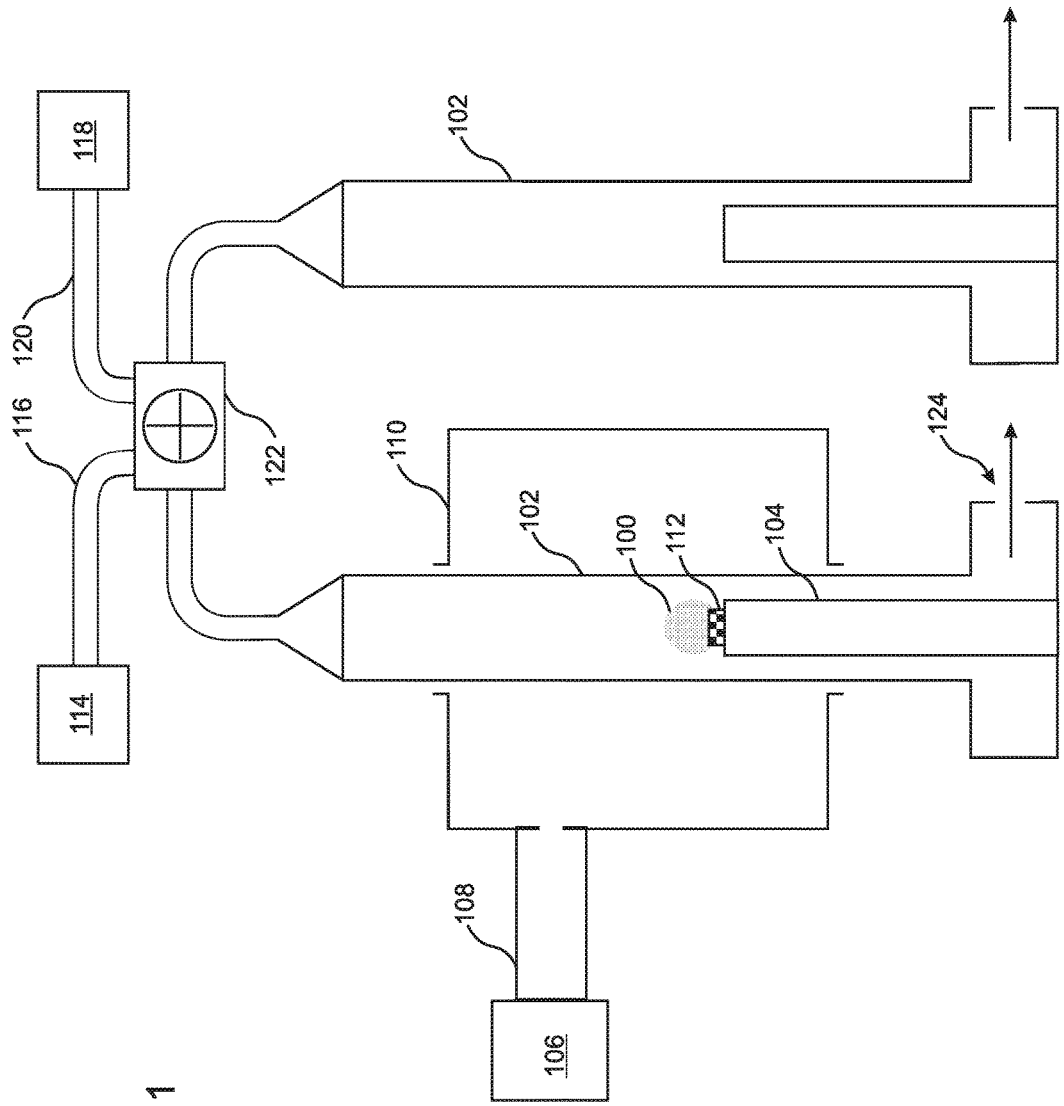
FIG. 1 is a cross sectional diagram illustrating an embodiment of the apparatus of the present invention.

The apparatus of the present invention is a CVD reactor that is able to create nanometric delta-doped layers with ultra-sharp interfaces between doped/undoped material. FIG. 1 is a schematic illustration of an embodiment of the disclosed reactor, in which a microwave plasma excitation zone 100 surrounds a substrate 112 supported by a substrate holder 104 in a reduced pressure region of a vertical quartz tube growth chamber 102. In various embodiments the growth chamber is a fused silica tube 102. In embodiments, the substrate holder 104 can heat the substrate 112 to a temperature of between 700 and 1100° C. as desired.

The plasma in this embodiment is produced by electromagnetic radiation generated by a 2.45 GHz magnetron 106 which is transmitted through a waveguide 108 to a cavity 110. In similar embodiments, the plasmas is created by another method known in the art, such as dc, rf, microwave, or terahertz excitation, combustion flames, or hot wires, filaments, or surfaces. The use of a cylindrical cavity in the embodiment of FIG. 1 enables the generation of a symmetrical plasma ball 100 above the substrate 112 and well separated from the walls of the quartz tube 102 by applying only a low microwave power density in the plasma 100.

In the embodiment of FIG. 1, during intrinsic (undoped) diamond growth, a mixture of purified $H_2+CH_4$ is fed from a first gas supply 114 through a first manifold 116 to the quartz tube 102, where it flows past the substrate 112 and out through an outlet 124 to a gas pumping system (not shown). In embodiments, a chemical "getter" reactant is also included in this gas mixture, as discussed in more detail below. Due to the smooth and unobstructed configurations of the manifold 116 and quartz tube 102, the flow of gas quickly becomes laminar in the region of the substrate 112 once the reaction has been initiated.

So as to provide delta doped layers in the epitaxial diamond, it is necessary to temporarily substitute a gas containing a dopant in place of the $H_2+CH_4$ provided by the first gas supply 114. In some embodiments where the doping is with boron, the gas mixture is switched briefly to $H_2+CH_4+B_2H_6$. According to the present invention, the dopant gas mixture is contained in a second gas supply 118, and is delivered to the quartz tube 102 through a second gas manifold 120 when the gas is switched between the two gas supplies 114, 118 by a gas supply switch 122.

If the gas supplies 114, 118 were simply switched, such that flow from the first supply 114 was halted and flow from the second supply 118 was initiated, the result would likely be to temporarily cause a turbulence and eddy currents in the flow of gas near the substrate 112, leading to "tails" or mixing of the gases in the transition region between the gas mixtures, and a correspondingly broad transition between epitaxial layers in the diamond. This effect is largely due to the sudden change in load or "impedance" that is encountered at the outlets of the gas supplies when a gas flow is interrupted or commenced, and in that regard it is conceptually similar to the reflections of electromagnetic energy such as radio frequency or laser beams that occurs when a sudden change or mismatch of impedance is encountered. Conventional approaches to minimizing this problem would be to switch the gases on and off slowly and gradually, and or to use a very low gas flow rate. However, both of these approaches would tend to broaden the transition between the epitaxial layers.

The present invention implements a novel approach to avoid this problem of turbulence, whereby the gas flows are not stopped, but are merely switched between the reactor and a second "dummy" gas load, such as a second dummy quartz tube 124 and manifold 120, which in embodiments is identical in design to the reactor quartz tube 102 and manifold 116. Making the dummy load physically similar or identical to the reactor ensures that the "impedances" are matched, however dummy loads that do not necessarily duplicate the physical configuration of the reaction chamber but nevertheless are configured to provide an impedance that matches the reaction chamber are included within the scope of the present invention.

The gas supply switch 122 is configured so as to provide a continuous, uninterrupted flow of gas simultaneously from both gas supplies 114, 118 to the two reaction chamber 102 and the dummy load 124, so that switching between the gasses consists merely in a change of direction of each gas from one destination to the other. Because neither gas flow is interrupted, and because the impedances are matched, i.e. in the embodiment of FIG. 1 the manifolds 116, 120 and quartz tubes 102, 124 are identical, the flow from each source is continuous, and the flow "impedance" seen by each source is constant, so that any generation of turbulence due to the switching process is minimized or eliminated.

This duel-load gas switching architecture and method allows embodiments to maintain a high gas flow rate and to switch the gas quickly and abruptly without triggering undue turbulence. For example, embodiments employ a gas flow rate of 950 sccm together with a gas switching time of less than 10 seconds. Keeping the gas flow rate high has the added advantage in various embodiments of suppressing gas buoyancy effects from the hot plasma "ball" 100 above the substrate 112, and thereby reducing the effects of any turbulence resulting from the heating of the plasma.

Embodiments further sharpen the layer transition by maintaining an extraordinarily slow epitaxial growth rate of between 30 and 90 nm per hour, as determined by secondary ion mass spectroscopy sputter profiling ("SIMS-SP") of previously grown epitaxial layers. In embodiments, the total gas pressure was 30 to 50 Torr and the microwave power was 1.5 kW. In various embodiments the gas compositional switching time immediately above the substrate is approximately equivalent to 1-2 angstrom of growth so that, for example, a 20 sec gas switching time implies a desired growth rate of 18-36 nm/hr. These growth rates were only slightly over the rate of etching of a diamond substrate in a similar carbon free plasma.

Further embodiments of the present invention include more than one "dummy" load and more than two gas sources and manifolds, so that a plurality of epitaxial layers can be created on the substrate having differing dopant levels and types. For example, embodiments with two dummy cylinders are able to produce alternating boron-doped and phosphorous-doped epitaxial layers, interspersed with undoped layers.

Obviously, a sharp transition between adjacent layers in an epitaxially grown diamond crystal requires that the diamond substrate surface must be highly polished so as to be as smooth as possible. However, the present inventors have realized that the necessary polishing of the substrate surface inevitably results in some subsurface damage to the substrate. This is problematic, because success of the delta-doping strategy in terms of high carrier mobility requires that the undoped regions near the delta doped layer, i.e. the region of the substrate near the polished surface, must be free of damage and defects, which would otherwise hinder the mobility of the carriers. Accordingly, the method of the present invention includes the additional step of etching the polished substrate surface so as to remove the subsurface damage caused by polishing while retaining the substrate smoothness.

Figure 4:
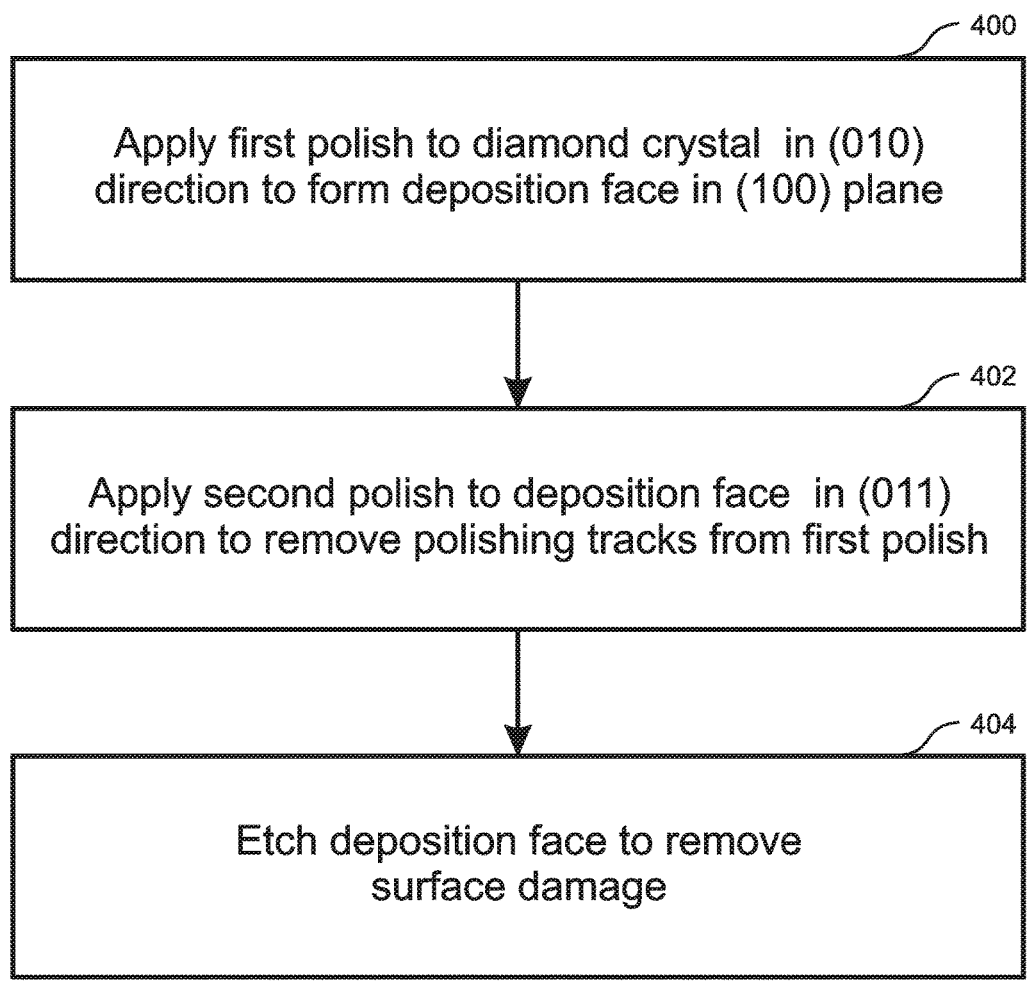
FIG. 4 is a flow diagram that illustrates an embodiment of a method of preparing a diamond crystal substrate for epitaxial deposition according to the present invention.

In embodiments, with reference to FIG. 4, the method includes orienting the polished surface of the substrate in or near the (100) plane. In various embodiments, a first, "rough" polish is applied, for example using a traditional cast iron skive plate charged with diamond grit of size larger than 2 microns and revolving at between 1500 to 3000 rpm, so as to polish the surface to be approximately in the (100) plane 400, with the crystal oriented such that skive plate motion is within 5 degrees of the easy "soft" polishing (010) direction. This first polishing step provides a macroscopically flat surface on the crystal that is oriented approximately in the (100) plane, and in embodiments within 1 degree of the (100) crystallographic plane, but generally leaves polishing tracks or grooves of a few nm depth.

In a second polishing step 402, in embodiments, another traditional cast iron skive plate, charged with diamond grit of size less than 0.5 microns and revolving at between 1500 to 3000 rpm, is used to polish the previously polished surface, without changing the near (100) plane orientation, with the crystal reoriented in the difficult 'hard' direction relative to the skive plate motion (within 5 degrees of the (011) direction. This step, which has a much slower polishing rate, is continued until the polishing tracks or grooves from the previous polishing step are no longer detectable by optical interferometry, producing a surface with a roughness, Sa, of less than 0.3 nm over at least an 80×80 micron sampling area.

In various embodiments, the polished surface of the substrate crystal is then homogeneously etched 404, for example in an inductively coupled reactive ion etcher, such as an Oxford Instruments Plasmalab 80 using argon and chlorine, to remove between 0.1 and 10 microns of the diamond surface. This step eliminates the subsurface polishing damage while retaining the smoothness of the polished surface.

In embodiments, the substrate is a plate of single crystal type IIa diamond (no nitrogen detectable by IR absorption spectroscopy) or type Ia HPHT diamond cut from a single (100) growth sector of a low dislocation density (less than $10^4/cm^2$, preferably less than $10^2/cm^2$) HPHT synthetic diamond. In various embodiments, the size of the substrate crystal can be, for example, 3×3×0.5 mm, 3.5×3.5×0.5 mm, or larger, and can display little or no birefringence when viewed between crossed polarizers. In embodiments, the substrate crystal has a dislocation density below $10^6$ cm$^{-2}$, and more preferably, below $10^2$ cm$^{-2}$.

In embodiments, the residual or inadvertent boron levels in nominally undoped diamond layers is maintained below $10^{17}$ cm$^{-3}$, and preferably below $10^{16}$ cm$^{-3}$ by employing a gas phase chemical getter to suppress the residual boron incorporation in the intrinsic layers. For example, in some of these embodiments hydrogen disulfide is added to the gas phase to form volatile boron sulfur complexes which, at elevated substrate surface temperatures of approximately 850 C or higher, reduces the probability of boron incorporating in the growing diamond layers. As an example, typical growth conditions in embodiments employ a flow of 900 sccm hydrogen (Pd diffusion cell purified), 1.4 sccm methane (ultra pure, 99.999%), 6 to 17 sccm of 0.1% $B_2H_6$ diluted in hydrogen, and 6 to 14 sccm of 0.1% $H_2S$ diluted in hydrogen.

Embodiments allow programmable doping for growing one or more layers of a pre-determined thickness. For example, the disclosed apparatus and method can be used to form a "two-humped" delta layer for which, according to calculations, the sheet carrier concentration should be increased several times compared to the structure with a single delta-layer.

Measured Results for Representative Embodiments

Figure 2A:
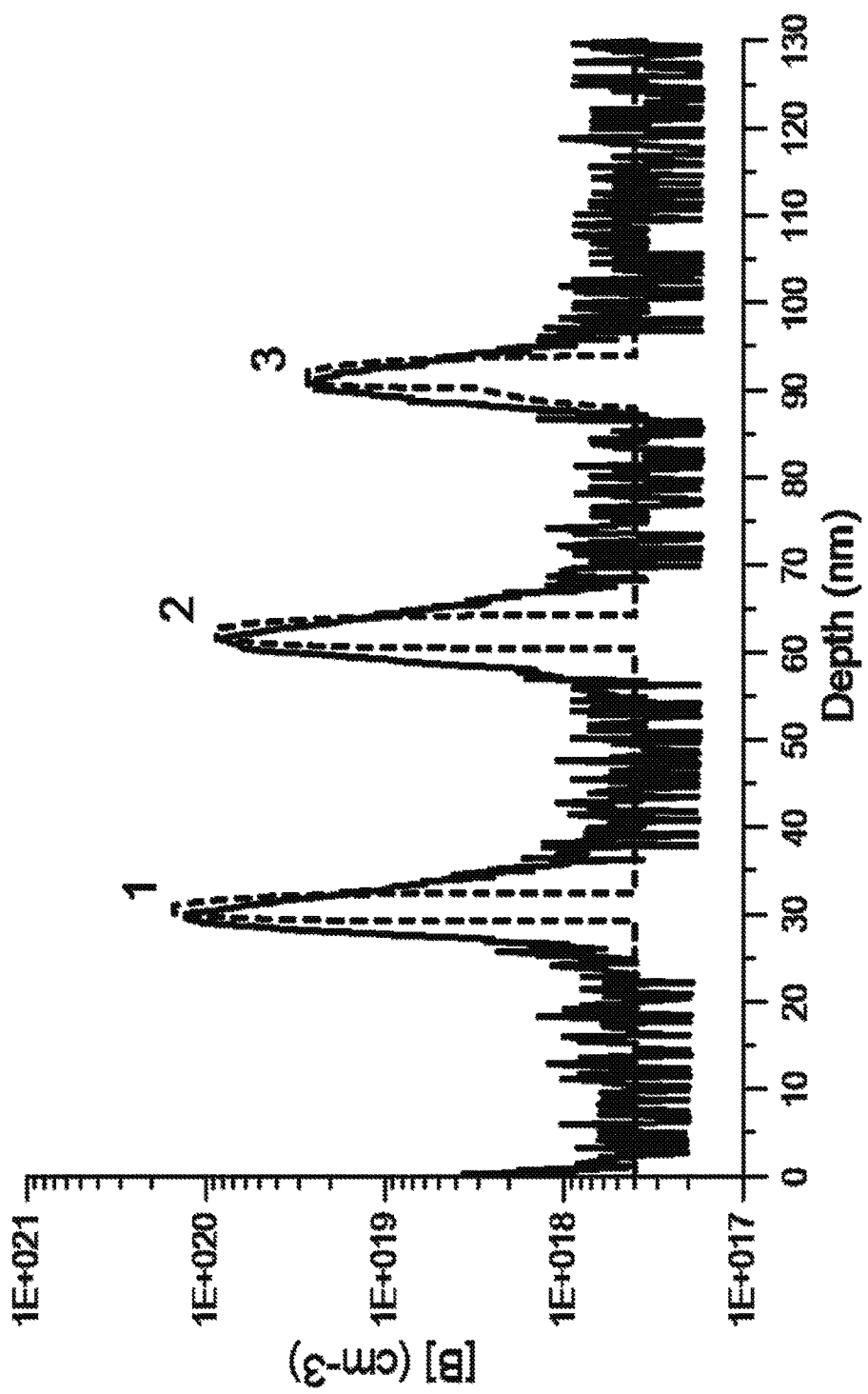
FIG. 2A is a plot of boron concentration profiles resulting from an embodiment of the present invention.
Figure 2B:
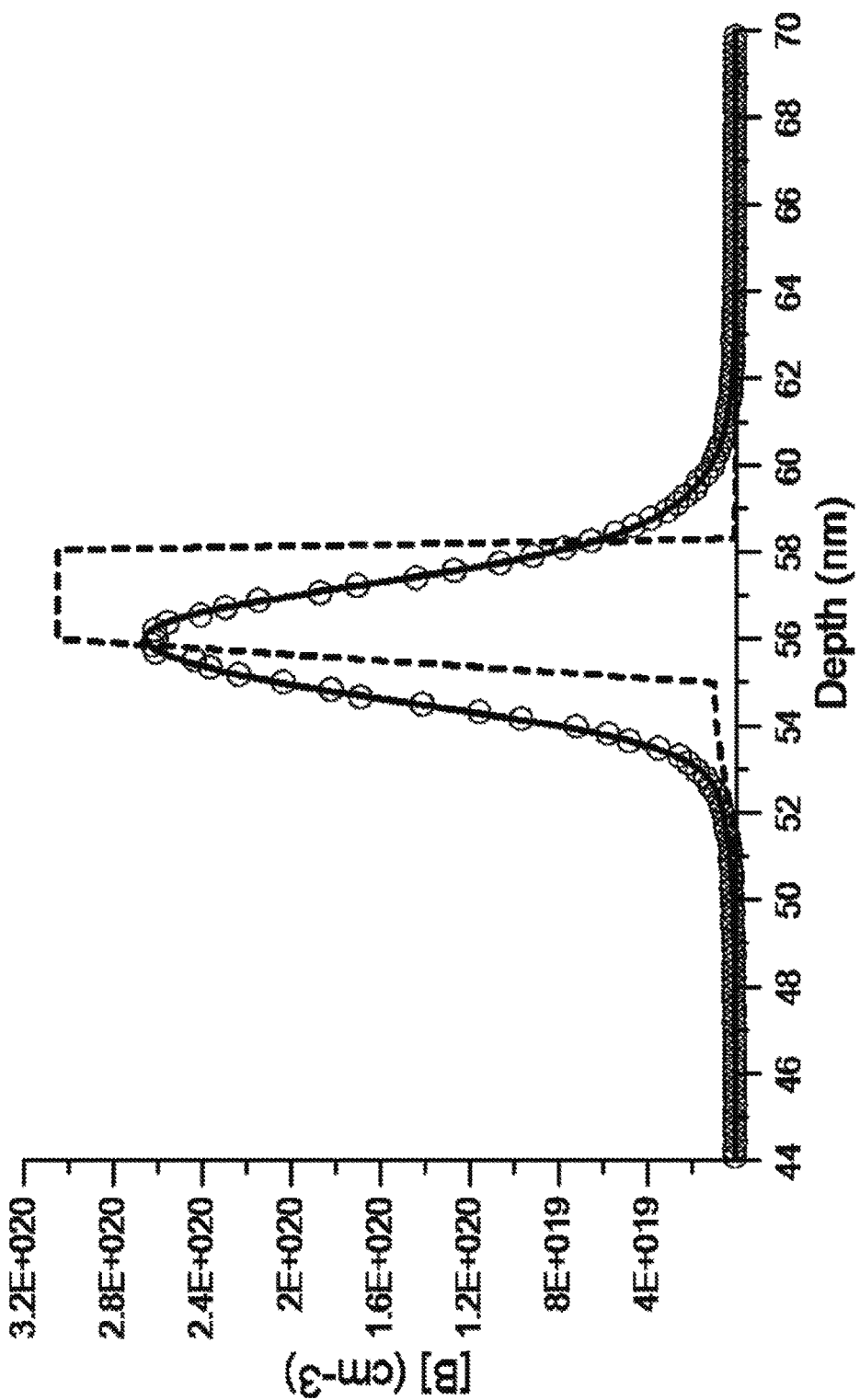
FIG. 2B is a plot of the SIMS-SP profile of a single delta layer of FIG. 2A.

Measurements have been made using the apparatus of FIG. 1 with a total gas flow of 950 sccm (standard cubic centimeters per minute). FIG. 2A is a plot of the resulting boron concentration profiles, as determined by SIMS-SP (solid line) and of the boron concentration profiles recovered using an analytical depth resolution function (dashed line), both as a function of depth in an epitaxially grown diamond. For this measurement, the methane flow was 1.4 sccm, and the B/C ratio was 18570 ppm (1), 12860 ppm (2), 8570 ppm (3) respectively. FIG. 2B is a plot of the SIMS-SP profile of a single delta layer (open circles) of the Boron concentration profiles recovered using an analytical depth resolution function (dashed line), and the resulting fit profile (solid line).

Figure 2C:
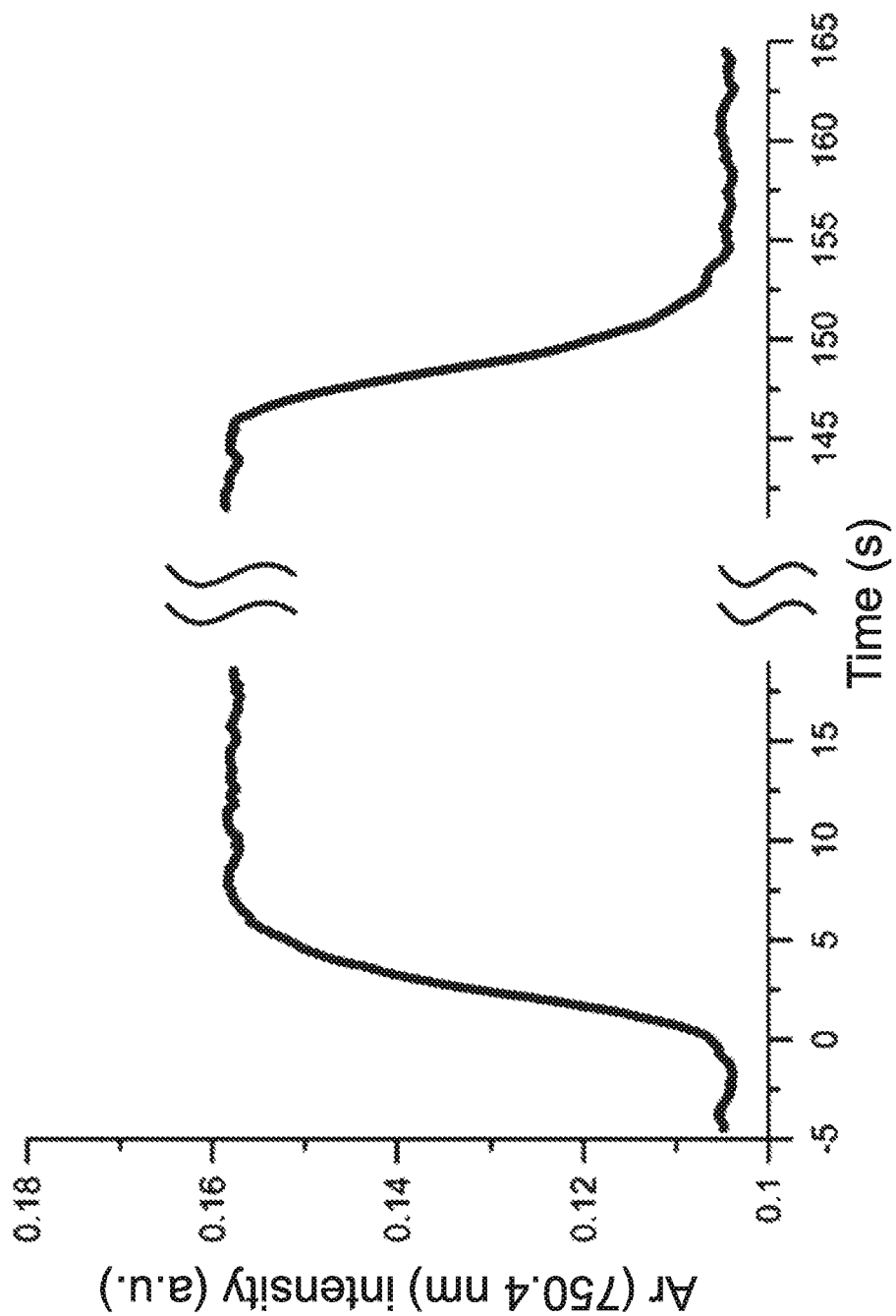
FIG. 2C is a plot of a time-resolved plasma optical emission (line Ar 750.4 nm) of an embodiment of the present invention.

To measure the switching time from one gas manifold to the other, argon was used instead of boron as the "dopant" so that a spectrometer could be used to measure the time-resolved intensity of the Ar emission line during gas mixture switching. The plasma was maintained in the $H_2+CH_4$ gas mixture at a total flow of 950 sccm, and was switched to $H_2+CH_4+Ar$ at time t=0. Then, the gas mixture was switched back to $H_2+CH_4$ at time t=147 s. FIG. 2C shows the time-resolved plasma optical emission (line Ar 750.4 nm), collected using a SOLAR TII spectrometer. Because of the low reactivity of the inert gas argon, the measured gas flow switching times (up to 10 s) in FIG. 1 represent the "gas-dynamic" times.

Figure 3A:
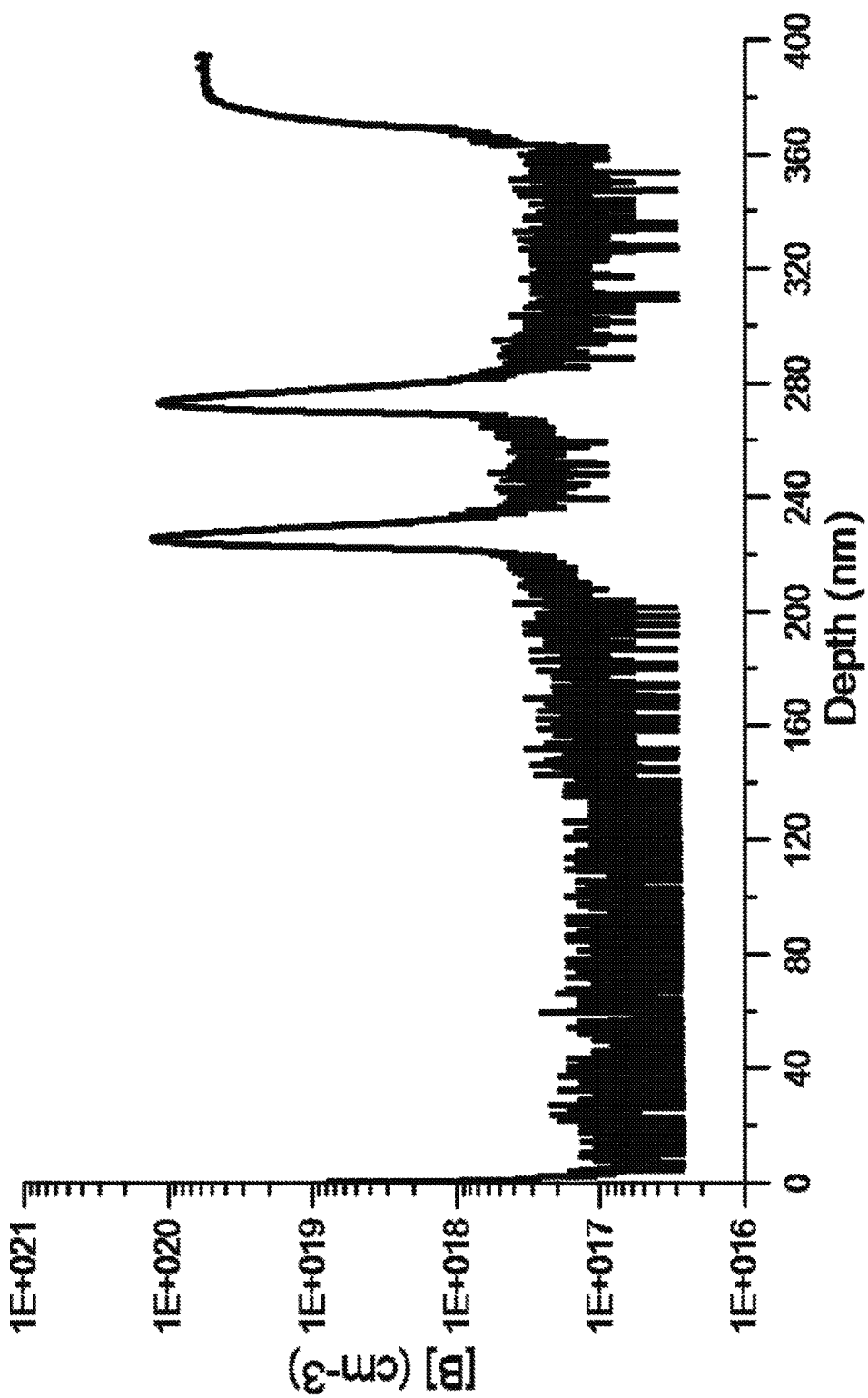
FIG. 3A is a SIMS-SP plot of the boron concentration in a sample created using the present invention wherein 2 separate delta layers were grown over an intrinsic buffer layer on a heavily boron doped layer.
Figure 3B:
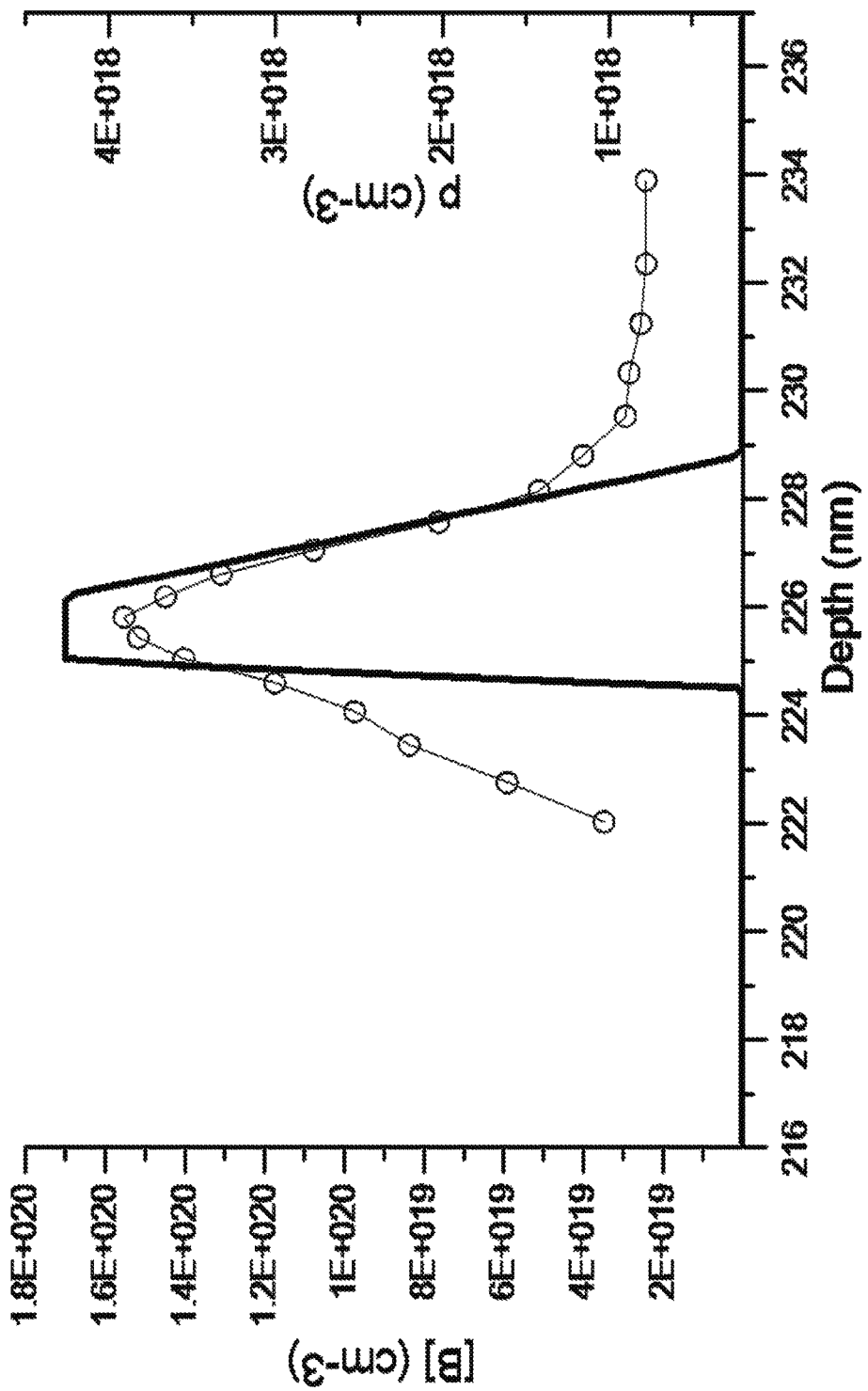
FIG. 3B presents the results of capacitance versus voltage measurements on mesa structures of the sample of FIG. 3A showing the apparent profile of the hole concentration in one delta layer.

FIG. 3A presents a SIMS-SP plot of the boron concentration in a sample wherein 2 separate delta layers were grown over an intrinsic buffer layer on a heavily boron doped layer. FIG. 3B presents the results of capacitance versus voltage measurements on mesa structures prepared on the sample shown in FIG. 3A, showing the apparent profile of the hole concentration in one delta layer. Note that the measured hole concentration outside the delta layer is more than an order of magnitude above the residual boron concentration measured by SIMS-SP of less than $4\times10^{17}$ cm–3.

There are many parallel electrical conduction paths in a sample with a capped single delta layer. These consist of conduction on the surface, in the bulk intrinsic capping layer, in the heavily doped delta layer, in the intrinsic layers on either side and adjacent to the delta layer, in the bulk intrinsic buffer layer, and in the diamond substrate. Surface conduction is prevented by oxidation of the diamond surface, but no other paths can be ignored. Conduction in the heavily doped delta layer is characterized by low mobilities and high carrier concentrations, typically 3 to 5 cm$^2$/Vsec and $10^{20}$ cm-3. Conversely, conduction in the CVD grown bulk intrinsic layers have high mobilities, greater than 1000 cm$^2$/Vsec, but low carrier concentrations. Conduction in the diamond substrate may vary depending on the unintentional doping of the HPHT substrate with B and N, but generally, these substrates are insulating.

For Hall effect measurements with sheet carrier concentrations below $10^{12}$ cm–2, the dominant conduction path is likely the high mobility bulk intrinsic buffer and capping layers, while for carrier concentrations above $10^{14}$ cm–2, the dominant contribution is from conduction in the low mobility, heavily doped delta layer.

The foregoing description of the embodiments of the invention has been presented for the purposes of illustration and description. Each and every page of this submission, and all contents thereon, however characterized, identified, or numbered, is considered a substantive part of this application for all purposes, irrespective of form or placement within the application.

The invention illustratively disclosed herein suitably may be practiced in the absence of any element which is not specifically disclosed herein and is not inherently necessary. However, this specification is not intended to be exhaustive. Although the present application is shown in a limited number of forms, the scope of the invention is not limited to just these forms, but is amenable to various changes and modifications without departing from the spirit thereof. One of ordinary skill in the art should appreciate after learning the teachings related to the claimed subject matter contained in the foregoing description that many modifications and variations are possible in light of this disclosure. Accordingly, the claimed subject matter includes any combination of the above-described elements in all possible variations thereof, unless otherwise indicated herein or otherwise clearly contradicted by context. In particular, the limitations presented in dependent claims below can be combined with their corresponding independent claims in any number and in any order without departing from the scope of this disclosure, unless the dependent claims are logically incompatible with each other.

I claim:

1. A method of preparing a diamond crystal substrate for epitaxial deposition thereupon of a delta doping layer, the method comprising:
    applying a first polishing to a deposition face of the diamond crystal, said first polishing being applied in a first polish direction that is within 5 degrees of the (010) direction of the diamond crystal, thereby providing a macroscopically flat surface on the diamond crystal that is oriented approximately in the (100) crystallographic plane of the diamond crystal;
    applying a second polishing to the deposition face of the diamond crystal, said second polishing being applied in a second polish direction that is within five degrees of the (011) direction of the diamond crystal; and
    subsequent to the first and second polishing steps, homogeneously etching the deposition face of the diamond crystal, thereby removing diamond material from the deposition surface sufficient to eliminate subsurface damage caused by the polishing steps.

2. The method of claim 1, wherein the second polishing is applied until polishing tracks resulting from the first polishing are no longer detectable by optical interferometry.

3. The method of claim 1, wherein applying the second polishing includes polishing the deposition face of the diamond crystal using a cast iron skive plate charged with diamond grit of size less than 0.5 microns and revolving at between 1500 rpm and 3000 rpm.

4. The method of claim 3, further comprising orienting the diamond crystal relative to the skive plate within five degrees of the (011) direction of the diamond crystal.

5. The method of claim 1, wherein after etching the polished face has a roughness Sa of less than 0.3 nm over at least an 80×80 micron sampling area.

6. The method of claim 1, wherein etching the polished face of the diamond crystal includes etching the polished face using an inductively coupled reactive ion etcher.

7. The method of claim 1, wherein etching the polished face of the diamond crystal includes etching the polished face using argon and chlorine to remove between 0.1 and 10 microns of the deposition face of the diamond crystal.

8. The method of claim 1, wherein the diamond crystal has a dislocation density below $10^6$ cm$^{-2}$.

9. The method of claim 1, wherein the diamond crystal has a dislocation density below $10^2$ cm$^{-2}$.

10. The method of claim 1, wherein the diamond crystal is a plate of single crystal type IIa diamond having no nitrogen detectable by IR absorption spectroscopy.

11. The method of claim 1, wherein the diamond crystal is a plate of single crystal type 1b HPHT diamond cut from a single (100) growth sector of a HPHT synthetic diamond having a dislocation density that is less than $10^4$/cm$^2$.

12. The method of claim 1, wherein the diamond crystal is a plate of single crystal type 1b HPHT diamond cut from a single (100) growth sector of a HPHT synthetic diamond having a dislocation density that is less than $10^2$/cm$^2$.

13. The method of claim 1, wherein the diamond crystal has dimensions of at least 3 mm×3 mm×0.5 mm.

14. The method of claim 1, wherein the diamond crystal has dimensions of at least 3.5 mm×3.5 mm×0.5 mm.

\* \* \* \* \*